United States Patent
Lim

(10) Patent No.: US 9,164,127 B2
(45) Date of Patent: Oct. 20, 2015

(54) CONTACTOR AND SEMICONDUCTOR TEST APPARATUS COMPRISING THE SAME

(75) Inventor: Tae-Youn Lim, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 344 days.

(21) Appl. No.: 13/571,865

(22) Filed: Aug. 10, 2012

(65) Prior Publication Data

US 2013/0141129 A1  Jun. 6, 2013

(30) Foreign Application Priority Data

Dec. 6, 2011 (KR) .......................... 10-2011-0129817

(51) Int. Cl.
G01R 31/20 (2006.01)
G01R 1/04 (2006.01)
H01L 21/00 (2006.01)

(52) U.S. Cl.
CPC .............. *G01R 1/0466* (2013.01); *H01L 21/00* (2013.01); *H01L 2221/00* (2013.01); *H01L 2925/00* (2013.01)

(58) Field of Classification Search
CPC . H01L 21/00; H01L 2221/00; H01L 2223/00; H01L 2924/00; H01L 2925/00; B24B 1/00; B24B 5/00; B24B 29/00; B24B 41/00; B24B 49/00; B65B 1/00; B65B 19/00; B65B 35/00
USPC ......... 324/509, 512, 513, 515, 519–535, 537, 324/750.01, 750.19, 750.22, 757.01, 324/750.24, 750.25, 757.02, 750.3, 754.01, 324/750.13, 750.15, 750.16, 750.17, 324/750.18, 762.01, 557–559, 754.09, 324/754.13, 756.01, 756.02, 754.03, 324/754.07, 754.08
See application file for complete search history.

(56) References Cited

U.S. PATENT DOCUMENTS

| | | | | |
|---|---|---|---|---|
| 4,952,113 | A * | 8/1990 | Fujioka | 414/416.08 |
| 5,498,294 | A * | 3/1996 | Matsushita et al. | 134/6 |
| 5,605,487 | A * | 2/1997 | Hileman et al. | 451/5 |
| 2002/0173229 | A1* | 11/2002 | Kobayashi | 451/5 |
| 2004/0082111 | A1* | 4/2004 | Yamauchi | 438/118 |
| 2006/0043990 | A1* | 3/2006 | Sato | 324/755 |
| 2007/0152655 | A1* | 7/2007 | Ham et al. | 324/158.1 |
| 2010/0247697 | A1* | 9/2010 | Ogata et al. | 425/116 |
| 2011/0156733 | A1* | 6/2011 | Yano | 324/750.16 |

FOREIGN PATENT DOCUMENTS

| | | |
|---|---|---|
| JP | 10-194452 | 7/1998 |
| KR | 1020070077365 | 7/2007 |
| KR | 1020110066659 | 6/2011 |

* cited by examiner

*Primary Examiner* — Huy Q Phan
*Assistant Examiner* — Temilade S Rhodes-Vivour
(74) *Attorney, Agent, or Firm* — F. Chau & Associates, LLC

(57) ABSTRACT

Provided is a test contactor for testing a semiconductor device which includes a cylinder, a piston which is configured to reciprocate between a first position and a second position according to a change in pressure in the cylinder, and a pressing part which is configured to change its location according to the reciprocating motion of the piston. The pressing part is configured to be in contact with the semiconductor device when the piston is located at the first position, and the pressing part is configured not to be in contact with the semiconductor device when the piston is located at the second position.

19 Claims, 14 Drawing Sheets

CONTACTOR AND SEMICONDUCTOR TEST APPARATUS COMPRISING THE SAME

CROSS-REFERENCE TO RELATED APPLICATION

This application claims priority under 35 U.S.C. 119 to Korean Patent Application No. 10-2011-0129817 filed on Dec. 6, 2011, the disclosure of which is hereby incorporated by reference herein in its entirety.

BACKGROUND

1. Technical Field

The present disclosure relates to a test contactor and a semiconductor test apparatus including the contactor.

2. Description of the Related Art

To ensure the reliability of the test results of a semiconductor device, leads of the semiconductor device may be required to be stably in contact with pins of a socket during the test. To provide leads of the semiconductor device which are stably in contact with the pins of the socket during the test, the leads of the semiconductor device may be pressed by using, for example, a handler having a pushing function, or a socket such as open top QFP (OTQ) having a pushing function.

However, in a case where a plurality of semiconductor devices are simultaneously tested by using one test board, there may be a slight difference in height between the semiconductor devices. In this case, when the semiconductor devices are pressed at the same time by using one handler, each of the semiconductor devices may be pressed differently by the handler. Accordingly, the semiconductor device having a relatively small height may be pressed relatively less by the handler. As a result, during the test, the leads of the semiconductor device may not be stably in contact with the pins of the socket, and thus the reliability of the test results may be reduced.

Further, in the case of using the socket having a pushing function, the socket may perform a pushing function by using a spring, and the elasticity of the spring may be reduced due to repeated use. In this case, since the leads of the semiconductor device may be pressed relatively less by the socket during the test, the leads of the semiconductor device may not be stably in contact with the pins of the socket, and thus the reliability of the test results may be reduced.

SUMMARY

Exemplary embodiments of the present inventive concept provide a contactor enabling stable contact between leads of a semiconductor device and pins of a socket by using one of pneumatic, hydraulic, and oleopneumatic pressures, and a semiconductor test apparatus including the contactor.

According to an exemplary embodiment of the present inventive concept, a test contactor for testing a semiconductor device is provided. The test contactor includes a cylinder, a piston which is configured to reciprocate between a first position and a second position according to a change in pressure in the cylinder, and a pressing part which is configured to change its location according to the reciprocating motion of the piston. The pressing part is configured to be in contact with the semiconductor device when the piston is located at the first position, and the pressing part is configured not to be in contact with the semiconductor device when the piston is located at the second position.

According to an exemplary embodiment of the present inventive concept, a semiconductor test apparatus is provided. The semiconductor test apparatus includes a test board, a socket mounted on the test board, a semiconductor device mounted on the socket, and a contactor mounted on the test board. The contactor includes a cylinder, a piston which is configured to reciprocate between a first position and a second position according to a change in pressure in the cylinder, and a pressing part which is configured to change its location according to the reciprocating motion of the piston. The pressing part is configured to be in contact with the semiconductor device when the piston is located at the first position, and the pressing part is configured not to be in contact with the semiconductor device when the piston is located at the second position.

According to an exemplary embodiment of the present inventive concept, a test contactor for testing a semiconductor device is provided. The test contactor includes an actuator which is configured to reciprocate between a first position and a second position according to a pressure differential in the actuator and a pressing part which is configured to change its location according to the reciprocating motion of the actuator. The pressing part is configured to be in contact with the semiconductor device when the actuator is located at the first position, and the pressing part is configured not to be in contact with the semiconductor device when the actuator is located at the second position.

In an embodiment, the test contactor may include a moving substrate connected to the pressing part and the actuator may include a cylinder and a piston which is configured to reciprocate between the first position and the second position according to a change in pressure in the cylinder. The moving substrate may be configured to reciprocate in a lengthwise direction of the cylinder according to the reciprocating motion of the piston and when the piston is located at the first position, the pressing part may be configured to apply a pressure to one of a lead or a conductive ball of the semiconductor device.

BRIEF DESCRIPTION OF THE DRAWINGS

Exemplary embodiments of the present inventive concept can be understood in more detail from the following detailed description taken in conjunction with the attached drawings, in which.

DETAILED DESCRIPTION OF EXEMPLARY EMBODIMENTS

Figure 1:
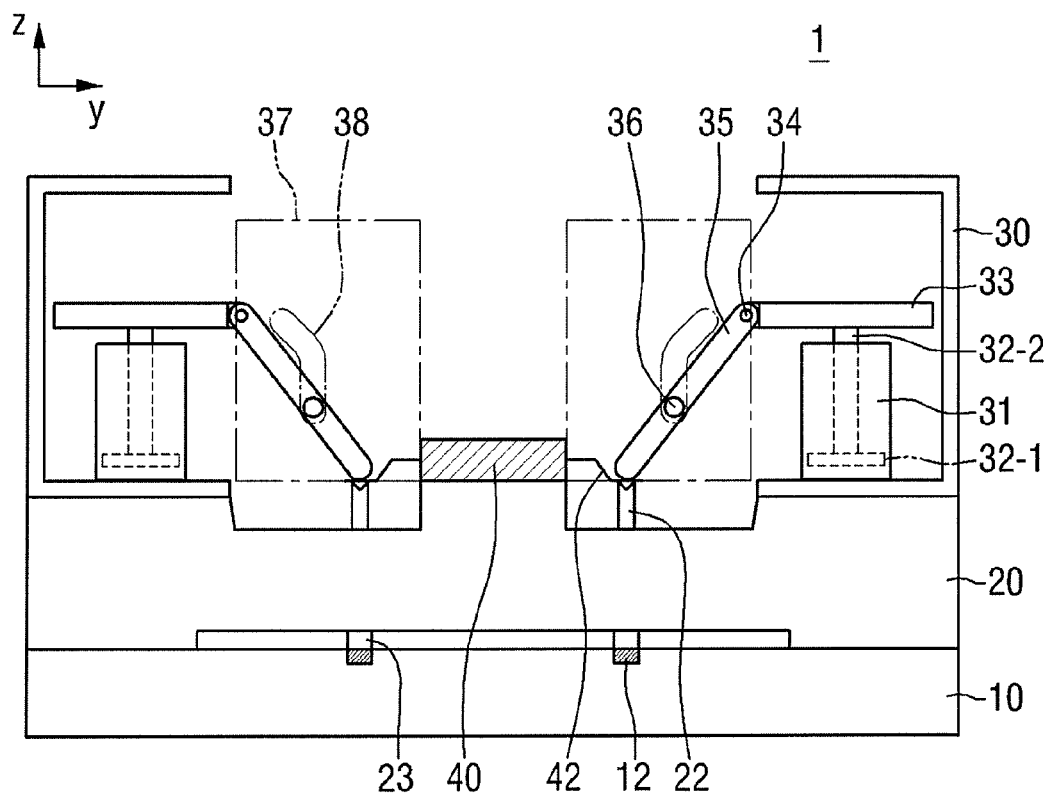
FIGS. 1, 4 and 5 are cross-sectional views for explaining an operation of a semiconductor test apparatus in accordance with an exemplary embodiment of the present inventive concept.

Exemplary embodiments of the present inventive concept and methods of accomplishing the same may be understood more readily by reference to the following detailed description of exemplary embodiments and the accompanying drawings. Exemplary embodiments of the present inventive concept may, however, be embodied in many different forms and should not be construed as being limited to exemplary embodiments set forth herein. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout. As used herein, the term "and/or" includes any and all combinations of one or more of the associated listed items.

The terminology used herein is for the purpose of describing exemplary embodiments of the present inventive concept only and is not intended to be limiting of exemplary embodiments of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
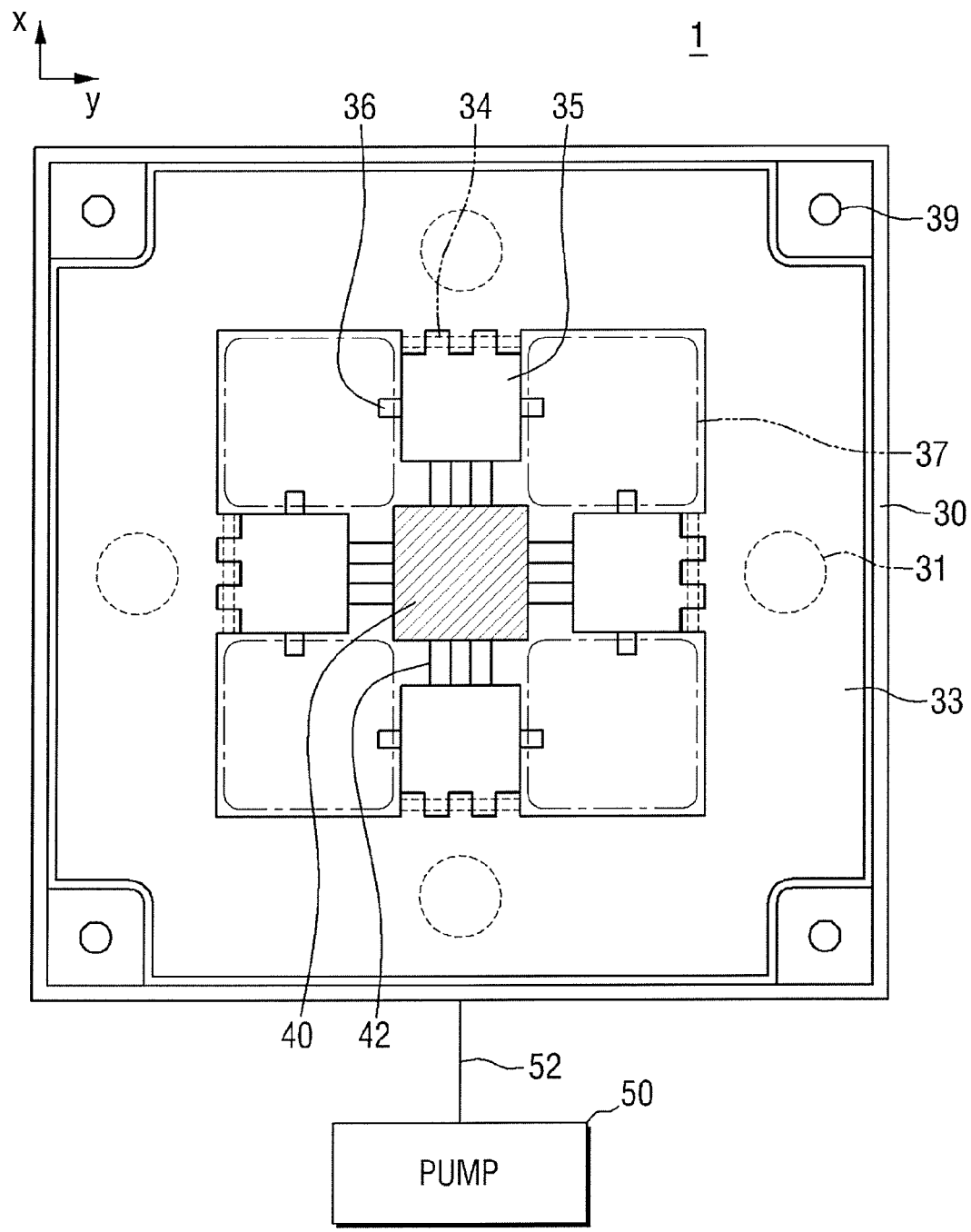
FIGS. 2 and 6 are plan views showing the semiconductor test apparatus of FIGS. 1 and 5 respectively.
Figure 3:
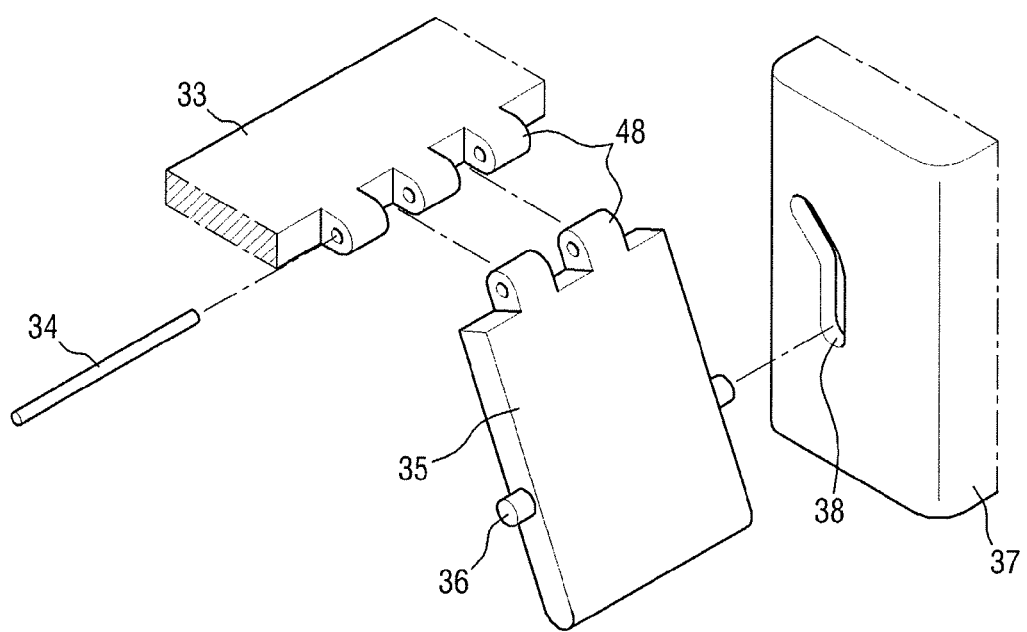
FIG. 3 is a perspective view for explaining a moving method of a pressing part of FIG. 1.
Figure 4:
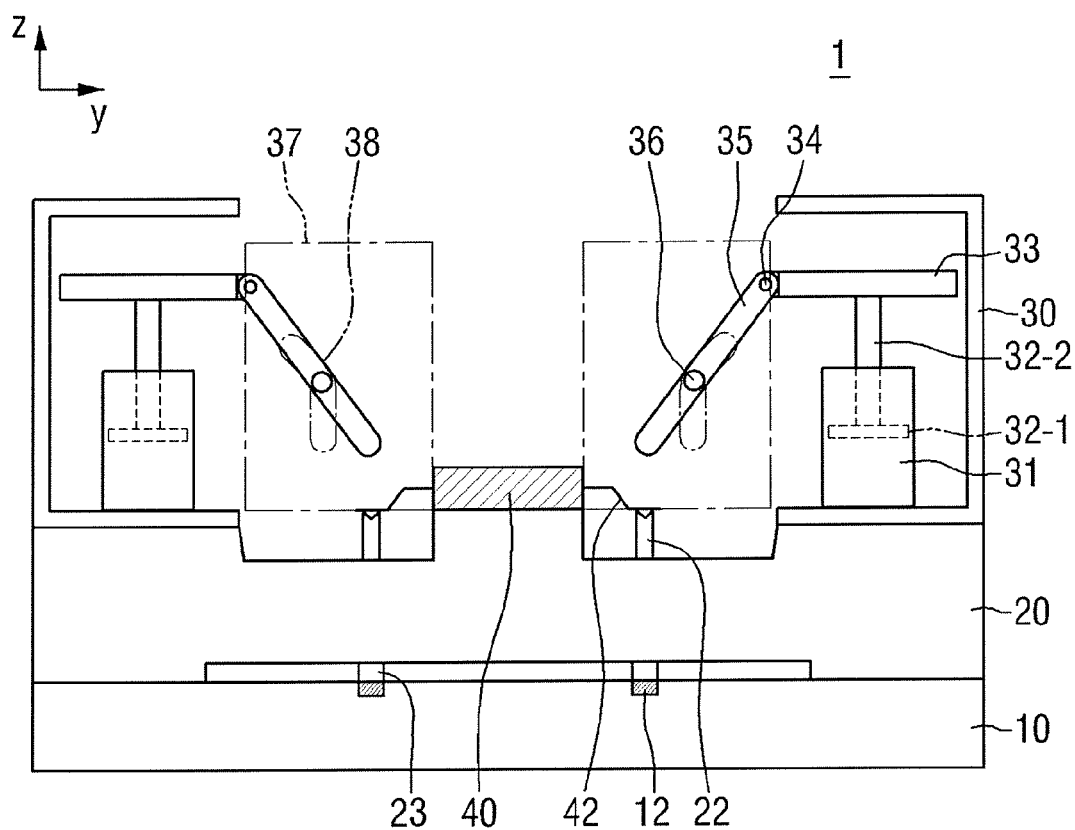
Figure 5:
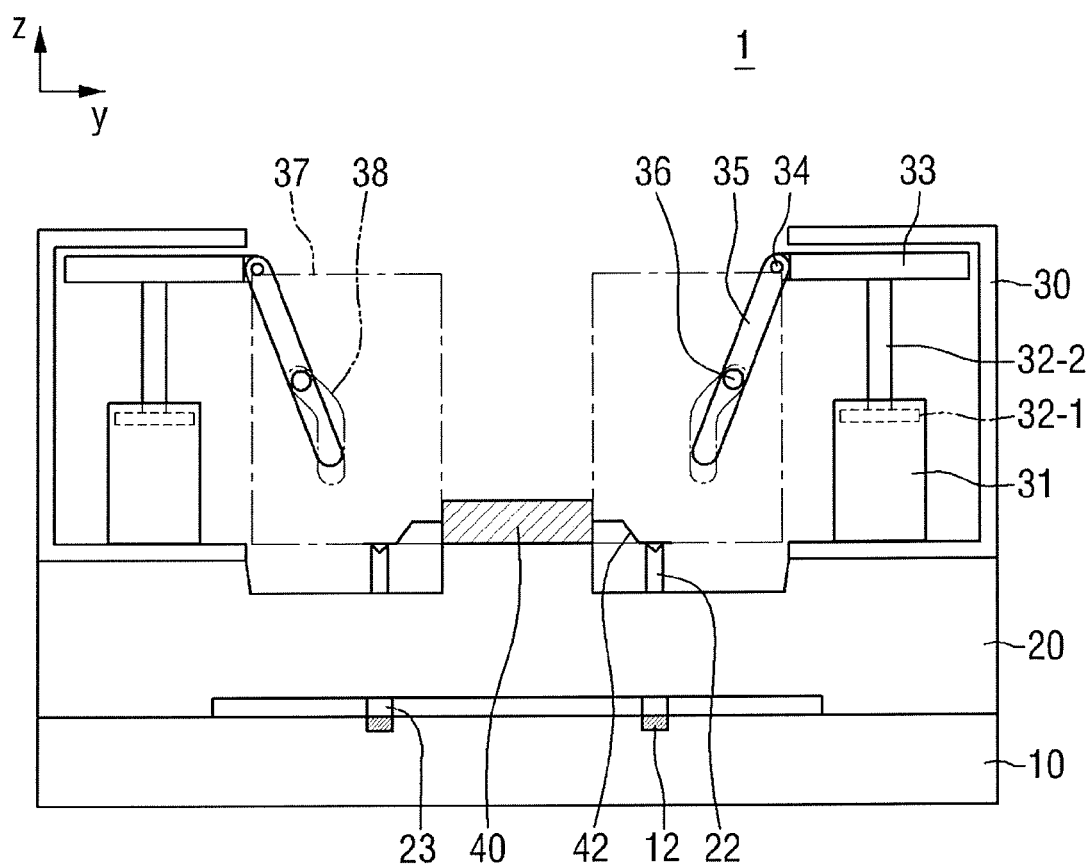
Figure 6:
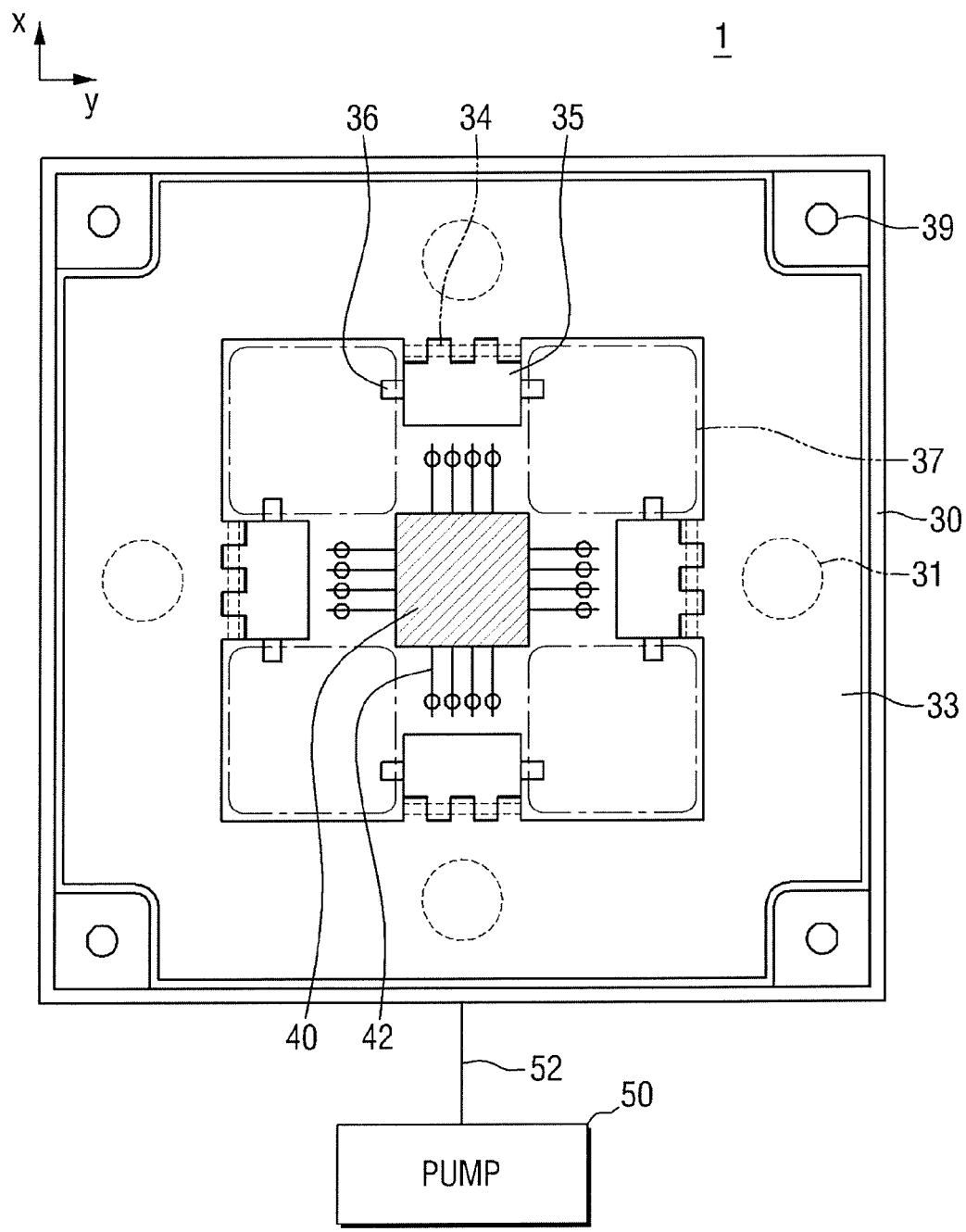
Figure 7:
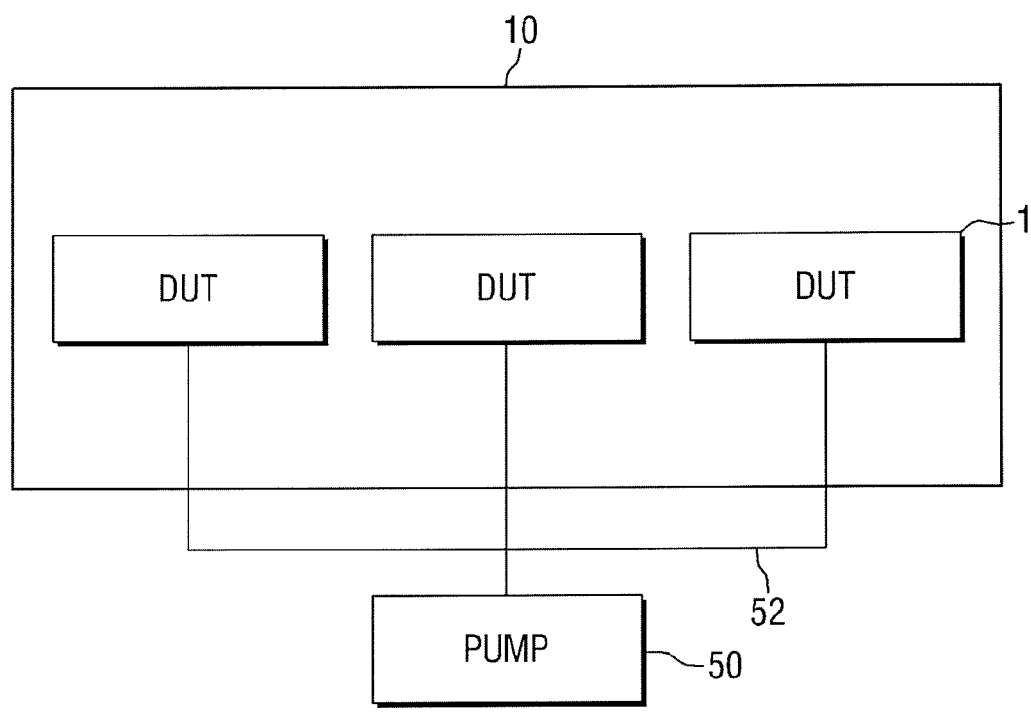
FIG. 7 is a conceptual diagram for explaining an operation of the semiconductor test apparatus in accordance with an exemplary embodiment of the present inventive concept.

A contactor and a semiconductor test apparatus in accordance with an exemplary embodiment of the present inventive concept will be described with reference to FIGS. 1 to 7. FIGS. 1, 4 and 5 are cross-sectional views for explaining an operation of a semiconductor test apparatus in accordance with an exemplary embodiment of the present inventive concept. FIGS. 2 and 6 are plan views showing the semiconductor test apparatus of FIGS. 1 and 5 respectively. FIG. 3 is a perspective view for explaining a moving method of a pressing part of FIG. 1. FIG. 7 is a conceptual diagram for explaining an operation of the semiconductor test apparatus in accordance with an exemplary embodiment of the present inventive concept.

Referring to FIG. 1, a semiconductor test apparatus 1 includes, for example, a test board 10, a socket 20, a semiconductor device 40, and a contactor 30. For example, the socket 20 may be mounted on the test board 10, and the semiconductor device 40 may be placed on the socket 20. Further, the contactor 30 may be mounted on the test board 10. For example, the contactor 30 may be mounted on the socket 20.

The test board 10 may include a circuit pattern for testing the semiconductor device 40. The test board 10 may include, for example, pads 12 electrically connected to the circuit pattern. The pads 12 may be electrically connected to socket pins 22 of the socket 20.

The socket 20 may be mounted on the test board 10 to electrically connect the semiconductor device 40 with the test board 10. Further, the socket 20 may have, for example, an open top portion to receive the semiconductor device 40. When the semiconductor device 40 is located on the open top portion of the socket 20, leads 42 of the semiconductor device 40 may come in contact with the socket pins 22. The socket pins 22 may be electrically connected to socket pads 23. The socket pads 23 may be in contact with the pads 12 of the test board 10. Consequently, the semiconductor device 40 may be electrically connected to the test board 10 to be tested by the test board 10.

The socket 20 may be a POGO type socket, but exemplary embodiments of the present inventive concept are not limited thereto. However, the socket 20 does not include a pusher capable of pressing the leads 42 of the semiconductor device 40. Accordingly, a separate contactor may be necessary for providing stable contact between the socket pins 22 and the leads 42 of the semiconductor device 40.

The semiconductor device 40 may be a logic device or memory device, but the semiconductor device 40 of exemplary embodiments of the present inventive concept are not limited thereto. For example, the semiconductor device 40 may be moved by a handler and placed on the socket 20.

The contactor 30 presses the leads 42 of the semiconductor device 40 placed on the socket pins 22 during the test such that the socket pins 22 can be stably in contact with the leads 42. Although the contactor 30 is mounted on the socket 20 in FIG. 1, the location of the contactor 30 is not limited thereto. Referring to FIGS. 1 and 2, the contactor 30 may be mounted on the socket 20 by fixing blocks 39, but exemplary embodiments of the present inventive concept are not limited thereto. The contactor 30 may include, for example, an actuator which includes a cylinder and a piston.

For example, referring to FIGS. 1 and 2, the contactor 30 may include cylinders 31, pistons 32-1, and pressing parts 35.

Each of the cylinders 31 may contain, for example, fluid. The cylinder 31 may be, e.g., one of a pneumatic cylinder, hydraulic cylinder, and oleopneumatic cylinder, but exemplary embodiments of the present inventive concept are not limited thereto. The pistons 32-1 may reciprocate, for example, in a lengthwise direction (e.g., z direction) of the cylinders 31 according to the change in pressure in the cylinders 31. For example, the change in pressure in the cylinders 31 may be the change in one of pneumatic, hydraulic, and oleopneumatic pressures. For example, all of the cylinders 31 of the semiconductor test apparatus 1 are connected to a fluid pipe 52. Accordingly, the cylinders 31 of the semiconductor test apparatus 1 may have the same inner pressure. Further, the pressures in the cylinders 31 of the semiconductor test apparatus 1 may be, for example, simultaneously controlled by a pump 50.

A moving substrate 33 may have, e.g., a doughnut shape, and may have a hollow opening. Although it seems that moving substrates 33 are provided at both sides of the contactor 30 and separated from each other in FIG. 1, the hollow opening formed between the moving substrates 33 at both sides is illustrated in FIG. 1, and it can be seen from FIG. 2 that the moving substrate 33 is formed of one plate. When the semiconductor device 40 is moved onto the socket 20 by the handler, the semiconductor device 40 may pass through the hollow opening. Accordingly, the area of the hollow opening may be, for example, larger than the area of the semiconductor device 40.

The pistons 32-1 may be connected to piston rods 32-2. The piston rods 32-2 may be connected to the moving substrate 33. Accordingly, when the pistons 32-1 reciprocate according to the change in pressure in the cylinders 31, the moving substrate 33 connected to the piston rods 32-2 also may reciprocate in the lengthwise direction (e.g., z direction) of the cylinders 31.

For example, referring to FIG. 2, a plurality of the cylinders 31 may be disposed below the moving substrate 33. Further, a plurality of the piston rods 32-2 are connected to the pistons 32-1. If the pressures in the cylinders 31 are simultaneously controlled by the pump 50, the piston rods 32-2 may be moved simultaneously. Accordingly, the moving substrate 33 may be moved in the lengthwise direction (e.g., z direction) of the cylinders 31 while maintaining horizontality along with the movement of the piston rods 32-2.

Referring to FIGS. 1 to 3, the moving substrate 33 is connected to the pressing parts 35. The pressing parts 35 may have, e.g., a plate shape, but exemplary embodiments of the present inventive concept are not limited thereto. One end of the moving substrate 33 may be, for example, hinge-connected to one end of each of the pressing parts 35. However, a specific hinge connection shape is not limited to a shape illustrated in FIGS. 1 to 3. One end of the moving substrate 33 may have a shape, for example, in which some portions periodically protrude for hinge coupling. One end of each of the pressing parts 35 also may have a shape, for example, in which some portions periodically protrude for hinge coupling. One end of the moving substrate 33 may engage with one end of the pressing part 35, and a hinge pin 34 may pass through the engaging portion 48. Accordingly, the pressing part 35 may rotate using, as an axis, the engaging portion 48 connected to the moving substrate 33.

As described above, since the moving substrate 33 is connected to the pressing parts 35, as the moving substrate 33 moves in the lengthwise direction (e.g., z direction) of the cylinders 31, the pressing parts 35 also may move along with the movement of the moving substrate 33. Consequently, the pressing parts 35 may change their locations according to the reciprocating motion of the pistons 32-1.

Subsequently, referring to FIGS. 1 and 2, if the pistons 32-1 move down, the moving substrate 33 and the pressing parts 35 may also move down, so that the pressing parts 35 can come in contact with the leads 42 of the semiconductor device 40. During the test, the pressing parts 35 may apply pressure to the leads 42 such that the leads 42 can be stably coupled with the socket pins 22.

Further, referring to FIGS. 4 to 6, when the pistons 32-1 move up, the moving substrate 33 and the pressing parts 35 may also move up, so that the pressing parts 35 can be separated from the leads 42 of the semiconductor device 40.

However, the moving path of the pressing part 35 may be determined by the shape of guide grooves 38 formed in guide blocks 37. Referring to FIG. 2, the guide blocks 37 may be disposed at both sides of the pressing part 35. Further, the guide grooves 38 may be formed in a specific shape in the guide blocks 37. Referring to FIGS. 2 and 3, guide protrusions 36 may be formed on both sides of the pressing part 35. The guide protrusions 36 may be inserted into the guide grooves 38. Accordingly, the guide protrusions 36 move along the guide grooves 38, and the moving path of the guide protrusions 36 may be determined by the shape of the guide grooves 38.

Each of the guide grooves 38 may have, for example, a V shape forming an obtuse angle, and may have a shape in which an angle between the guide groove 38 and a thickness direction (e.g., y direction) of the guide blocks 37 increases as it goes toward a lower portion of the guide groove 38. However, the shape of the guide grooves 38 is not limited thereto.

Referring to FIGS. 1, 4 and 5, as the pistons 32-1 move up, an angle between the pressing parts 35 and the moving substrate 33 may decrease. That is, the cylinders 31 and the pressing parts 35 are located on the lateral side of the semiconductor device 40, and as the pistons 32-1 move up, the pressing parts 35 may get close to the cylinders 31, and drift apart from the semiconductor device 40. The reason that the pressing parts 35 drift apart from the semiconductor device 40 as the pistons 32-1 move up is because the guide grooves 38 have a V shape forming an obtuse angle. Since the pressing parts 35 drift apart from the semiconductor device 40 as the pistons 32-1 move up, more space may be formed between the pressing parts 35 and the semiconductor device 40. Accordingly, after completing the test, the semiconductor device 40 may be readily transferred by the handler. Since sufficient moving space is ensured, it is possible to prevent damage from occurring during the transfer of the semiconductor device 40.

Hereinafter, the operation of the semiconductor test apparatus in accordance with an exemplary embodiment of the present inventive concept will be described with reference to FIGS. 1, 2, and 4 to 6. For convenience of explanation, the position of the pistons 32-1 shown in FIG. 1 is defined as a first position, the position of the pistons 32-1 shown in FIG. 5 is defined as a second position, and the position of the pistons 32-1 shown in FIG. 4 is defined as a third position.

Referring to FIGS. 1 and 2, when the pistons 32-1 are located at the first position, the pressing parts 35 may come in contact with the leads 42 of the semiconductor device 40. The first position of the pistons 32-1 may be defined as a position of the pistons 32-1 when the pressing parts 35 are in contact with the leads 42 of the semiconductor device 40. For the testing of the semiconductor device 40, the semiconductor test apparatus 1 may be controlled to decrease the pressure in the cylinders 31, so that the pistons 32-1 and the moving substrate 33 move down and the pressing parts 35 can come in contact with the leads 42 of the semiconductor device 40. For example, one end of each of the pressing parts 35, which is not hinge-coupled, may come in contact with the leads 42 at the same time as each other. Since the pressing parts 35 apply pressure to the leads 42 in contact with the socket pins 22, the socket pins 22 can be stably in contact with the leads 42 during the test.

Referring to FIGS. 5 and 6, when the pistons 32-1 are located at the second position, the pressing parts 35 are not in contact with the leads 42 of the semiconductor device 40. The second position of the pistons 32-1 may be defined as a position of the pistons 32-1 when the pressing parts 35 are not in contact with the leads 42 of the semiconductor device 40. When the test is completed, the semiconductor test apparatus 1 may be controlled to increase the pressure in the cylinders 31, so that the pistons 32-1 and the moving substrate 33 move up and the pressing parts 35 can drift apart from the leads 42 of the semiconductor device 40. As described above, since the guide grooves 38 have a V shape forming an obtuse angle, the distance between the pressing parts 35 and the semiconductor device 40 when the pistons 32-1 are in the second direction is larger than the distance between the pressing parts 35 and the semiconductor device 40 when the pistons 32-1 are located at the first position.

The pistons 32-1 may reciprocate between the first position and the second position. Referring to FIG. 4, the pistons 32-1 may be located at the third position between the first position and the second position. The moving substrate 33 may be further apart from the cylinders 31 when the pistons 32-1 are located at the third position than when the pistons 32-1 are located at the first position. Accordingly, the location of the pressing parts 35 may be changed such that the pressing parts 35 are apart from the leads 42 of the semiconductor device 40. For example, when the pistons 32-1 are located at the third position, the pressing parts 35 may be further apart from the semiconductor device 40 than when the pistons 32-1 are located at the first position.

In the contactor 30 and the semiconductor test apparatus 1 in accordance with an exemplary embodiment of the present inventive concept, the contactor 30 is controlled by using one of, for example, pneumatic, hydraulic, and oleopneumatic pressures without using a consumable member such as a spring. Accordingly, even though the test is repeatedly conducted, the contactor 30 can stably press the leads 42 of the semiconductor device 40.

Further, in the contactor 30 and the semiconductor test apparatus 1 in accordance with an exemplary embodiment of the present inventive concept, since a manual type is used such that one contactor 30 may press one semiconductor device 40, even though there is a difference in height between semiconductor devices, sufficient pressure may be applied to each of the semiconductor devices. Further, since the semiconductor test apparatus 1 in accordance with an exemplary embodiment of the present inventive concept includes the separate contactor 30, a handler incapable of performing a pushing function may be used when the semiconductor device 40 is transferred before or after the test.

Further, referring to FIG. 7, a plurality of semiconductor test apparatuses 1 (devices under test (DUTs)) are disposed on the test board 10. Since all of the semiconductor test apparatuses 1 are connected to the fluid pipe 52, they can be simultaneously controlled by the pump 50. According to Pascal's principle, the same pressure may be applied to each of the semiconductor test apparatuses 1. Accordingly, it is possible to minimize errors occurring in the control of the semiconductor test apparatuses 1. Further, in the semiconductor test apparatus 1 in accordance with an exemplary embodiment of the present inventive concept, since the contactor 30 is controlled by using one of, for example, the pneumatic, hydraulic, and oleopneumatic pressures, even if the number of the semiconductor test apparatuses 1 for performing the test at the same time increases, it is possible to control a plurality of semiconductor test apparatuses 1 by using a force required to control one semiconductor test apparatus 1 according to Pascal's principle.

Figure 8:
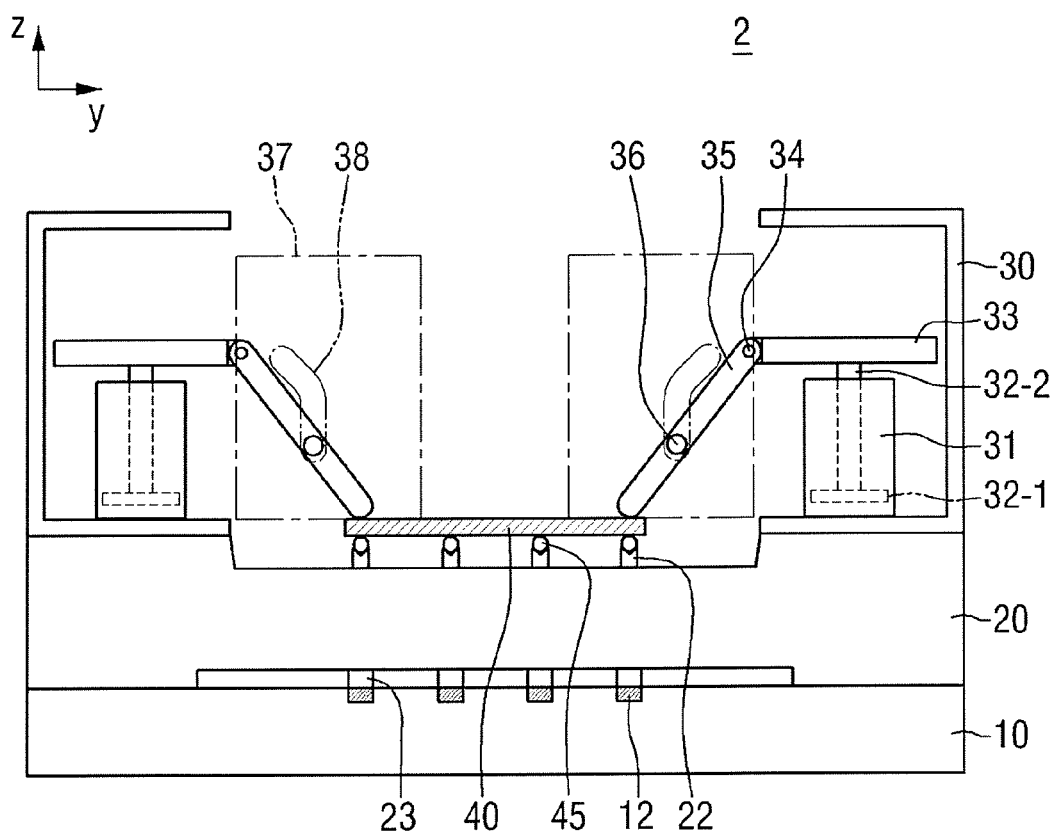
FIG. 8 is a cross-sectional view for explaining an operation of a semiconductor test apparatus in accordance with an exemplary embodiment of the present inventive concept.

A contactor and a semiconductor test apparatus in accordance with an exemplary embodiment of the present inventive concept will be described with reference to FIG. 8. The following description of the present exemplary embodiment of the present inventive concept illustrated in FIG. 8 will be given focusing on differences between this embodiment and the contactor 30 and the semiconductor test apparatus 1 of FIG. 1. FIG. 8 is a cross-sectional view for explaining an operation of the semiconductor test apparatus in accordance with an exemplary embodiment of the present inventive concept.

Referring to FIG. 8, unlike the semiconductor device 40 included in the semiconductor test apparatus 1 (see FIG. 1), the semiconductor device 40 included in a semiconductor test apparatus 2 in accordance with the present exemplary embodiment of the present inventive concept may include, for example, conductive balls 45 instead of the leads 42 (see FIG. 1). The conductive balls 45 may be, e.g., solder balls, without being limited thereto.

Accordingly, the socket pins 22 may come in contact with the conductive balls 45 of the semiconductor device 40. Further, during the test, the pressing parts 35 may apply pressure to the conductive balls 45 while being in contact with the semiconductor device 40 without being in direct contact with the conductive balls 45. Consequently, the socket pins 22 and the conductive balls 45 can be stably in contact with each other by the pressing parts 35 during the test.

Figure 9:
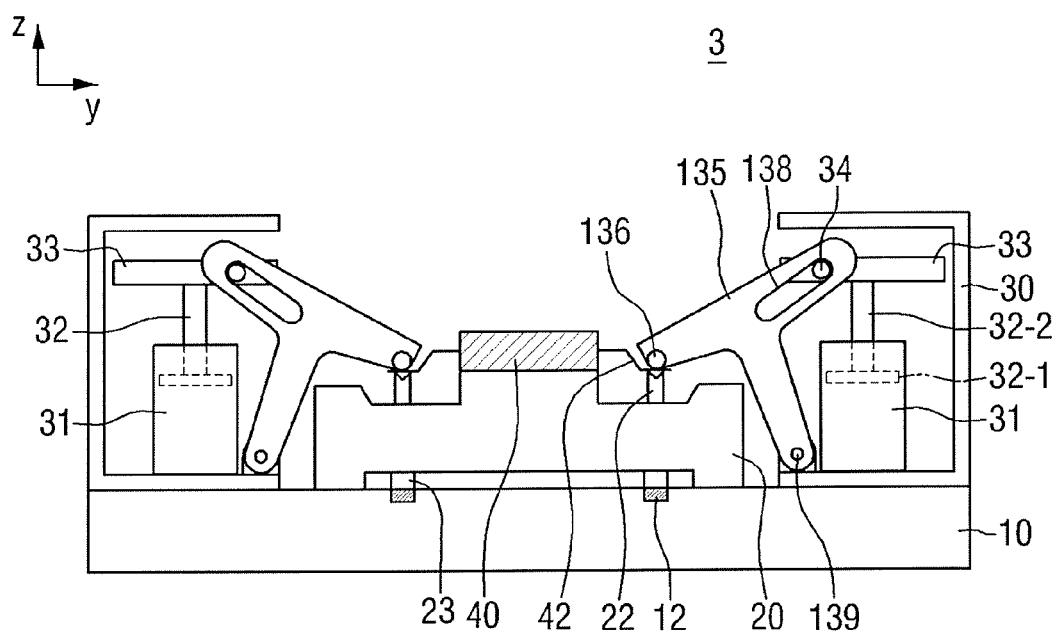
FIGS. 9 and 12 are cross-sectional views for explaining an operation of a semiconductor test apparatus in accordance with an exemplary embodiment of the present inventive concept.
Figure 10:
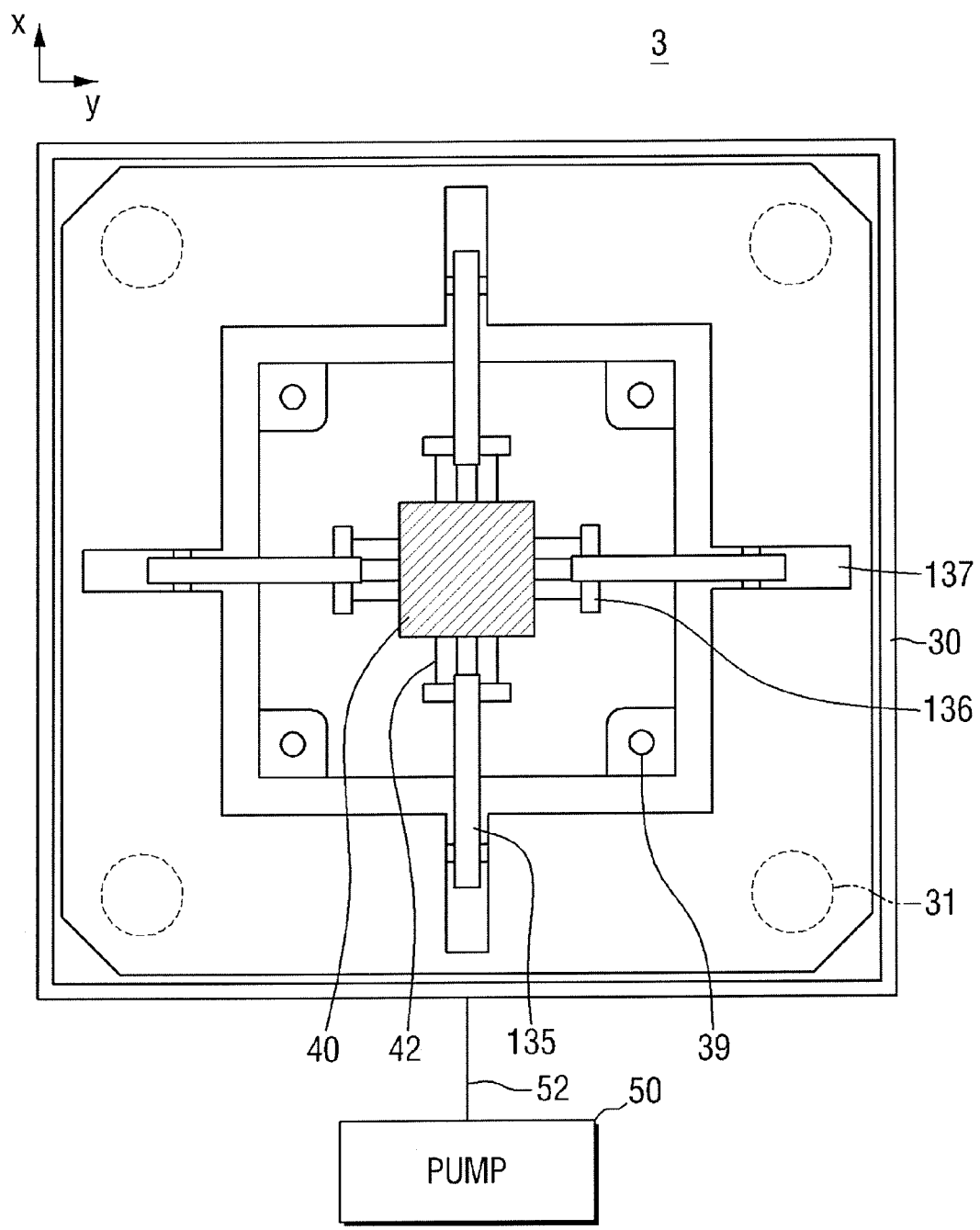
FIGS. 10 and 13 are plan views of the semiconductor test apparatus of FIGS. 9 and 12 respectively.
Figure 11:
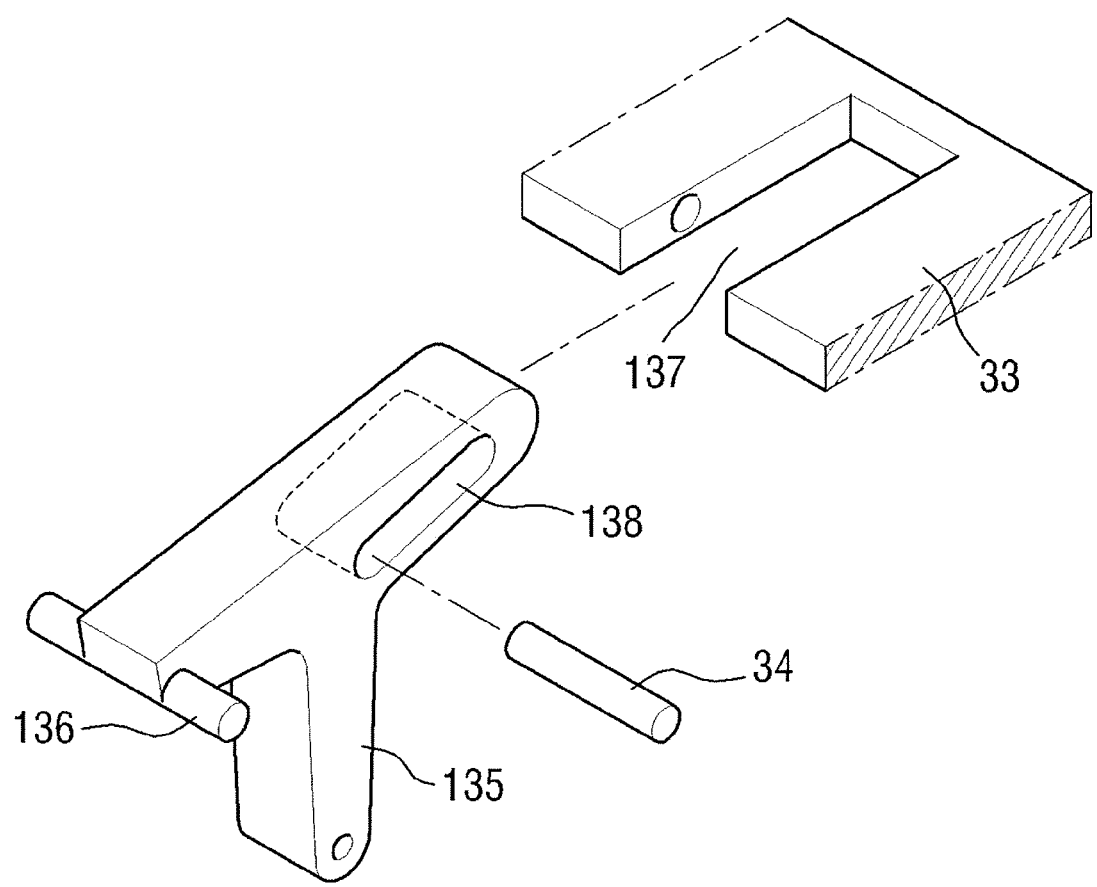
FIG. 11 is a perspective view for explaining a moving method of a pressing part of FIG. 9.
Figure 12:
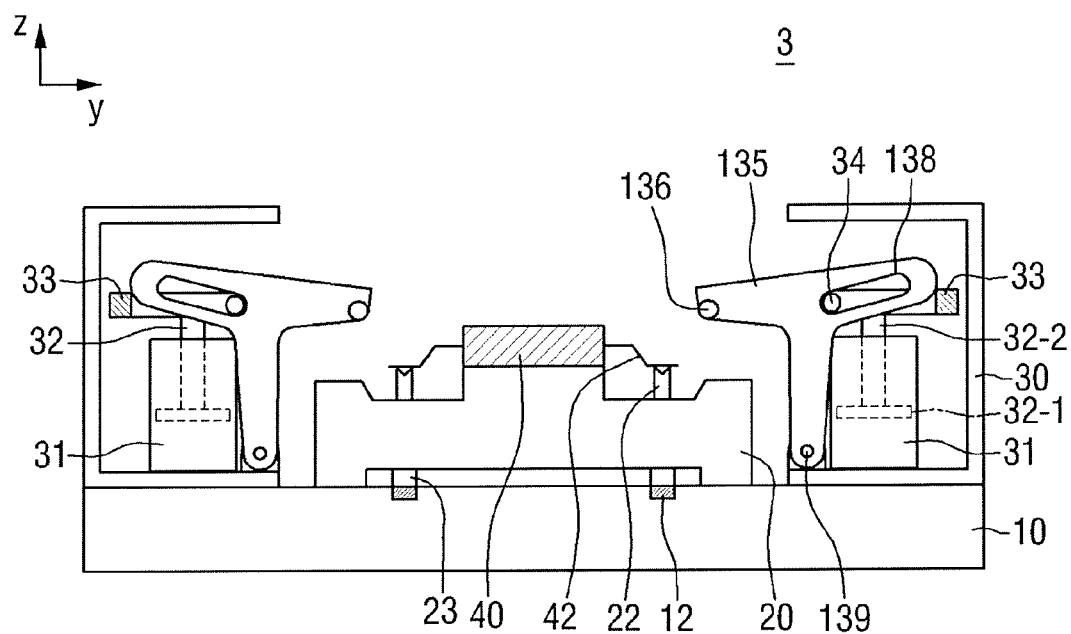
Figure 13:
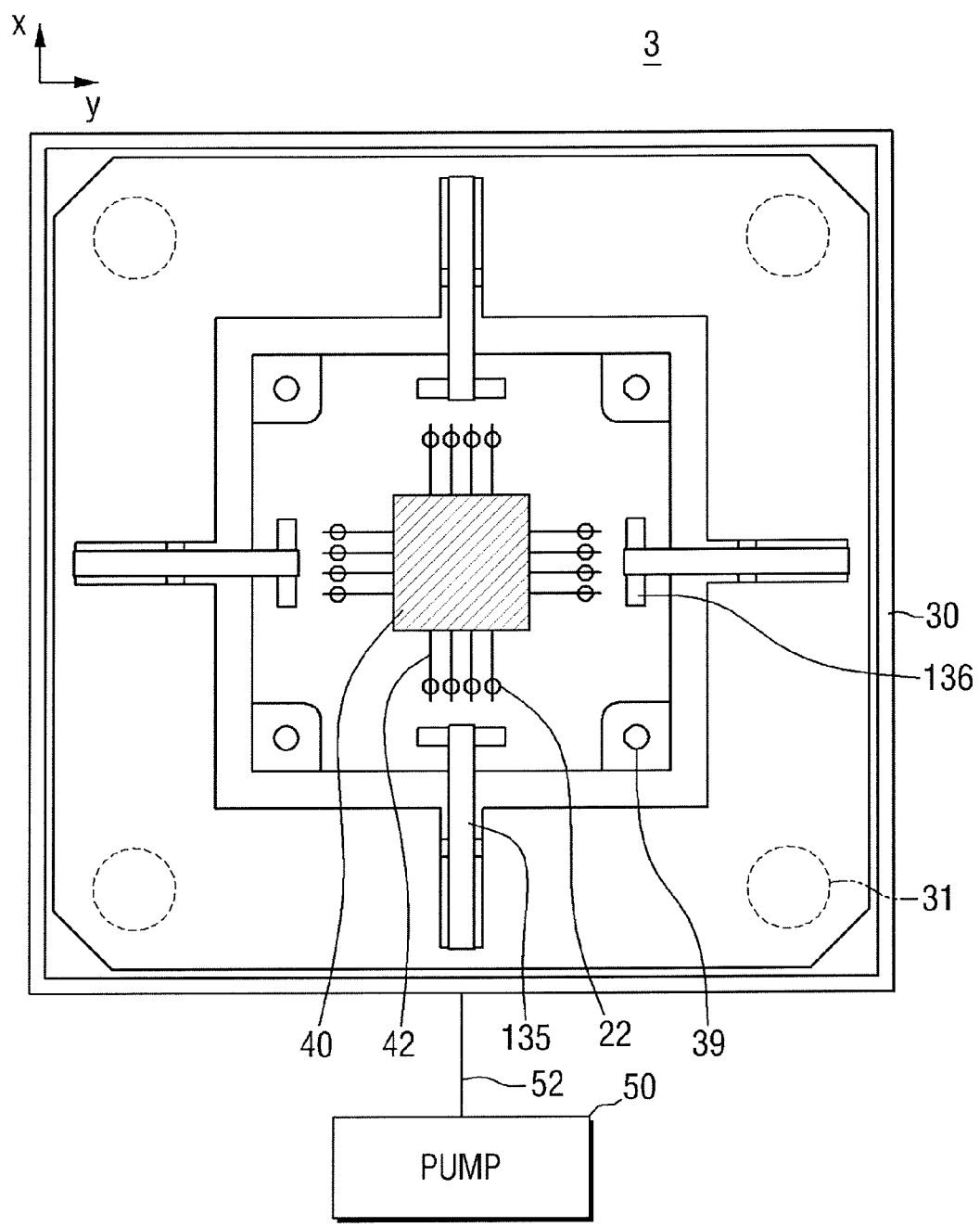

A contactor and a semiconductor test apparatus in accordance with an exemplary embodiment of the present inventive concept will be described with reference to FIGS. 9 to 13. The following description of the present exemplary embodiment of the present inventive concept illustrated in FIGS. 9-13 will be given focusing on differences between this embodiment and the contactor 30 and the semiconductor test apparatus 1 of FIG. 1. FIGS. 9 and 12 are cross-sectional views for explaining an operation of the semiconductor test apparatus in accordance with an exemplary embodiment of the present inventive concept. FIGS. 10 and 13 are plan views of the semiconductor test apparatus of FIGS. 9 and 12 respectively. FIG. 11 is a perspective view for explaining a moving method of a pressing part of FIG. 9.

Referring to FIGS. 9, 10, 12 and 13, a semiconductor test apparatus 3 in accordance with the present exemplary embodiment of the present inventive concept is different in operation from the semiconductor test apparatus 1 (see FIG. 1). Referring to FIGS. 9 and 10, when the pistons 32-1 move up, the moving substrate 33 moves up, and pressing parts 135 move down such that the pressing parts 135 can come in contact with the leads 42 of the semiconductor device 40. Further, referring to FIGS. 11 and 12, when the pistons 32-1 move down, the moving substrate 33 moves down and the pressing parts 135 move up such that the pressing parts 135 can be separated from the leads 42 of the semiconductor device 40.

For example, referring to FIGS. 9 and 10, the contactor 30 may be mounted on the test board 10 by the fixing blocks 39, for example, to surround the socket 20. The pressing parts 135 may be located on the lateral side of the semiconductor device 40, and the pressing parts 135 may have, e.g., T shape, but exemplary embodiments of the present inventive concept are not limited thereto. Lower end portions of the pressing parts 135 may be, for example, hinge-connected to the bottom surface of the contactor 30 by using hinge pins 139. Since the lower end portions of the pressing parts 135 are hinge-connected to the bottom surface, the pressing parts 135 may rotate around the lower end portions of the pressing parts 135 according to the reciprocating motion of the pistons 32-1.

Referring to FIG. 10, since the pressing parts 135 rotate around the lower end portions of the pressing parts 135, there may be need for a space for rotation of the pressing parts 135. Accordingly, the cylinders 31 may be separated from the pressing parts 135 by a predetermined distance without being located on the lateral side of the pressing parts 135.

Referring to FIGS. 9 to 11, one end of each of the pressing parts 135 may be, for example, hinge-coupled with one end of the moving substrate 33. A hollow portion 138 may be formed at one end portion of each of the pressing parts 135. The hollow portion 138 may be formed, e.g., in parallel to one surface of the pressing part 135, but exemplary embodiments of the present inventive concept are not limited thereto. Further, an open groove 137 may be formed at one end of the moving substrate 33. One end portion of the pressing part 135 may be inserted into the open groove 137 of the moving substrate 33 and the hinge pin 34 may pass through the hollow portion 138 of the pressing part 135.

Further, an extending portion 136 may be formed at the other end portion of the pressing part 135 where the hollow portion 138 is not formed, but exemplary embodiments of the present inventive concept are not limited thereto. The thickness of the extending portion 136 may be, for example, larger than the thickness of the pressing part 135 such that the extending portion 136 can readily come in contact with the leads 42.

The hollow portion 138 of the present exemplary embodiment of the present inventive concept may serve as the guide grooves 38 (see FIG. 1) of the semiconductor test apparatus 1 (see FIG. 1). That is, the moving path of the pressing part 135 may be determined by the shape of the hollow portion 138.

In the semiconductor test apparatus 3 in accordance with an exemplary embodiment of the present inventive concept, lower end portions of the pressing parts 135 may be, for example, hinge-connected to the bottom surface of the contactor 30. Since the hollow portions 138 are formed in the pressing parts 135, when the pistons 32-1 move up, the pressing parts 135 may get close to the semiconductor device 40, and when the pistons 32-1 move down, the pressing parts 135 may drift apart from the semiconductor device 40.

For example, an operation of the semiconductor test apparatus in accordance with an exemplary embodiment of the present inventive concept will be described with reference to FIGS. 9, 10, 12 and 13. For convenience of explanation, the position of the pistons 32-1 shown in FIG. 9 is defined as a fourth position, and the position of the pistons 32-1 shown in FIG. 12 is defined as a fifth position.

Referring to FIGS. 9 and 10, when the pistons 32-1 are located at the fourth position, the pressing parts 135 may come in contact with the leads 42 of the semiconductor device 40. The fourth position of the pistons 32-1 may be defined as a position of the pistons 32-1 when the pressing parts 135 are in contact with the leads 42 of the semiconductor device 40. For the testing of the semiconductor device 40, the semiconductor test apparatus 3 may be controlled to increase the pressure in the cylinders 31, so that the pistons 32-1 and the moving substrate 33 move up. Accordingly, the pressing parts 135 rotate around the lower end portions in a direction close to the semiconductor device 40, so that the pressing parts 135 can come in contact with the leads 42 of the semiconductor device 40. For example, the extending portion 136 may come in contact with the leads 42 at the same time. Since the pressing parts 135 apply pressure to the leads 42 in contact with the socket pins 22, the socket pins 22 can be stably in contact with the leads 42 during the test.

Referring to FIGS. 12 and 13, when the pistons 32-1 are located at the fifth position, the pressing parts 135 are not in contact with the leads 42 of the semiconductor device 40. The fifth position of the pistons 32-1 may be defined as a position of the pistons 32-1 when the pressing parts 135 are not in contact with the leads 42 of the semiconductor device 40. When the test is completed, the pistons 32-1 and the moving substrate 33 move down and the pressing parts 135 rotate around the lower end portions of the pressing parts 135 in a direction apart from the semiconductor device 40, so that the pressing parts 135 can be separated from the leads 42 of the semiconductor device 40. Since the pressing parts 135 rotate around the lower end portions of the pressing parts 135 in the direction apart from the semiconductor device 40, the pressing parts 135 may be apart from the semiconductor device 40. The distance between the pressing parts 135 and the semiconductor device 40 when the pistons 32-1 are located in the fifth position may be, for example, larger than the distance between the pressing parts 135 and the semiconductor device 40 when the pistons 32-1 are located at the fourth position. Accordingly, after completing the test, the semiconductor device 40 may be readily transferred by the handler. Since sufficient moving space is ensured, it is possible to prevent damage from occurring during the transfer of the semiconductor device 40.

Figure 14:
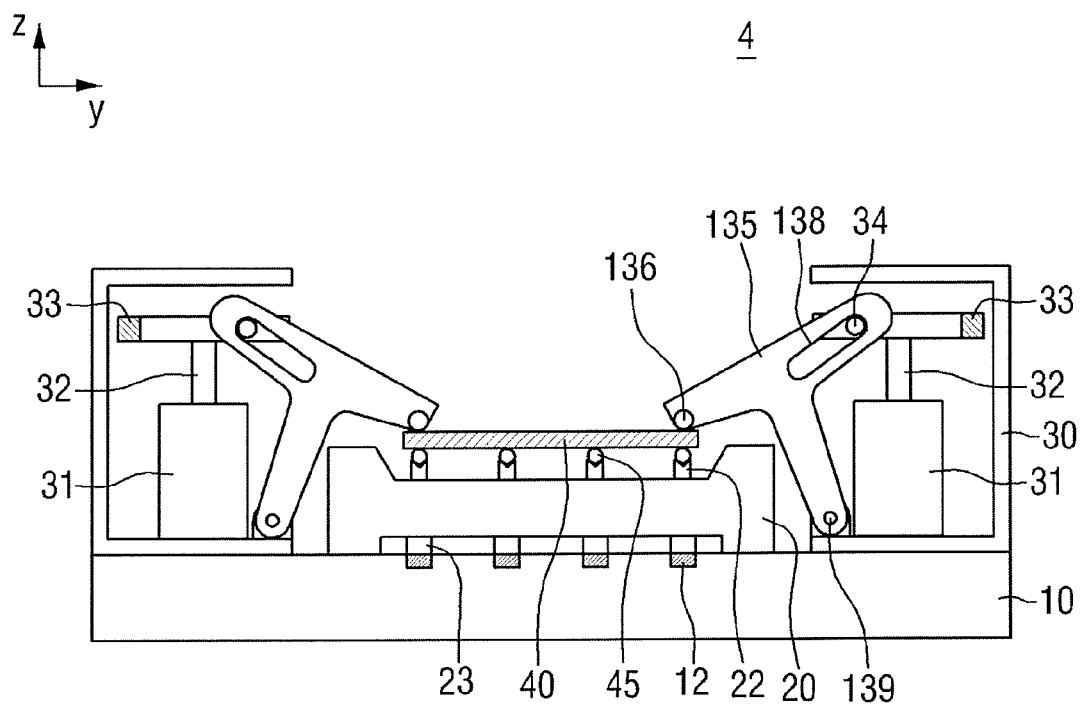
FIG. 14 is a cross-sectional view for explaining an operation of a semiconductor test apparatus in accordance with an exemplary embodiment of the present inventive concept.

A contactor and a semiconductor test apparatus in accordance with an exemplary embodiment of the present inventive concept will be described with reference to FIG. 14. The following description of the present exemplary embodiment of the present inventive concept illustrated in FIG. 14 will be given focusing on differences between this embodiment and the contactor 30 and the semiconductor test apparatus 3 of FIG. 9. FIG. 14 is a cross-sectional view for explaining an operation of the semiconductor test apparatus in accordance with an exemplary embodiment of the present inventive concept.

Referring to FIG. 14, unlike the semiconductor device 40 included in the semiconductor test apparatus 3 (see FIG. 9), the semiconductor device 40 included in a semiconductor test apparatus 4 in accordance with the present exemplary embodiment of the present inventive concept may include, for example, conductive balls 45 instead of the leads 42 (see FIG. 9). The conductive balls 45 may be, e.g., solder balls, without being limited thereto.

Accordingly, the socket pins 22 may come in contact with the conductive balls 45 of the semiconductor device 40. Further, during the test, the pressing parts 135 may apply pressure to the conductive balls 45 while being in contact with the semiconductor device 40 without being in direct contact with the conductive balls 45. Consequently, the socket pins 22 and the conductive balls 45 can be stably in contact with each other by the pressing parts 135 during the test.

Having described exemplary embodiments of the present inventive concept, it is further noted that it is readily apparent to those of ordinary skill in the art that various modifications may be made without departing from the spirit and scope of the invention which is defined by the metes and bounds of the appended claims.

What is claimed is:

1. A test contactor for testing a semiconductor device comprising:
    a cylinder;
    a piston which is configured to reciprocate between a first position and a second position according to a change in pressure in the cylinder;
    a pressing part which is configured to change its location according to the reciprocating motion of the piston,
    wherein the pressing part is configured to be in contact with the semiconductor device when the piston is located at the first position, and wherein the pressing part is configured not to be in contact with the semiconductor device when the piston is located at the second position; and
    a guide block,
    wherein the guide block comprises a V-shaped guide groove configured to guide a path of the pressing part, wherein the V-shaped guide groove forms an obtuse angle, wherein the pressing part included at least one protrusion formed thereon which is insertable into the V-shaped guide groove, and wherein the at least one protrusion is configured to move along the V-shaped guide groove.

2. The test contactor of claim 1, wherein the pressing part is configured to be located at a fourth position when the piston is located at the first position,
    wherein the pressing part is configured to be located at a fifth position when the piston is located at a third position between the first position and the second position, and
    wherein in the fifth position, the pressing part is separated more from the semiconductor device than in the fourth position.

3. The test contactor of claim 1, further comprising a moving substrate which is disposed between the piston and the pressing part and is configured to reciprocate in a lengthwise direction of the cylinder according to the reciprocating motion of the piston,
   wherein the pressing part is connected to the moving substrate and wherein the pressing part is configured to change its location according to the reciprocating motion of the piston.

4. The test contactor of claim 3, further comprising a piston rod which is connected to the piston and which extends outwardly from the cylinder, and wherein the piston rod is located between the piston and the moving substrate.

5. The test contactor of claim 3, wherein one end of the pressing part is hinge-connected to one end of the moving substrate.

6. The test contactor of claim 5, wherein when the piston is located at the first position, another end of the pressing part is configured to be in contact with the semiconductor device.

7. The test contactor of claim 3, wherein the moving substrate includes a hollow opening, and wherein an area of the hollow opening is larger than an area of the semiconductor device.

8. The test contactor of claim 1, wherein when the piston is located at the first position, the pressing part is configured to be in contact with leads of the semiconductor device.

9. The test contactor of claim 1, wherein an end portion of the pressing part is hinge-connected to a bottom surface of the contactor, and
   wherein the pressing part is rotatable around the end portion of the pressing part according to the reciprocating motion of the piston.

10. A semiconductor test apparatus comprising:
    a test board;
    a socket mounted on the test board;
    a semiconductor device mounted on the socket;
    a contactor mounted on the test board, wherein the contactor comprises a cylinder, a piston which is configured to reciprocate between a first position and a second position according to a change in pressure in the cylinder, and a pressing part which is configured to change its location according to the reciprocating motion of the piston, wherein the pressing part is configured to be in contact with the semiconductor device when the piston is located at the first position, and wherein the pressing part is configured not to be in contact with the semiconductor device when the piston is located at the second position; and
    a plurality of guide blocks disposed at opposing sides of the pressing part, wherein the guide blocks include V-shaped guide grooves forming an obtuse angle, wherein the pressing part includes a plurality of protrusions formed thereon which are insertable into the V-shaped guide grooves and configured to move along the V-shaped guide grooves.

11. The semiconductor test apparatus of claim 10, wherein the pressing part is configured to be located at a fourth position when the piston is located at the first position,
    wherein the pressing part is configured to be located at a fifth position when the piston is located at a third position between the first position and the second position, and
    wherein in the fifth position, the pressing part is separated more from the semiconductor device than in the fourth position.

12. The semiconductor test apparatus of claim 10, further comprising:
    a piston rod which is connected to the piston and extends outwardly from the cylinder; and
    a moving substrate which is disposed between the piston rod and the pressing part and which is configured to reciprocate in a lengthwise direction of the cylinder according to the reciprocating motion of the piston, and
    wherein the pressing part is connected to the moving substrate and is configured to change its location according to the reciprocating motion of the piston.

13. The semiconductor test apparatus of claim 12, wherein one end of the pressing part is hinge-connected to one end of the moving substrate.

14. The semiconductor test apparatus of claim 10, wherein the semiconductor device includes a plurality of leads, and
    wherein when the piston is located at the first position, the pressing part is configured to be in contact with the leads of the semiconductor device.

15. The semiconductor test apparatus of claim 10, wherein the cylinder is one selected from the group consisting of a pneumatic cylinder, a hydraulic cylinder, and an oleopneumatic cylinder.

16. The semiconductor test apparatus of claim 12, wherein the pressing part further comprises a hollow portion formed in a first end thereof in parallel to one surface of the pressing part, wherein a second end of the pressing part is connected to a bottom surface of the contactor via a first hinge pin, and wherein a second hinge pin is disposed through the hollow portion of the pressing part to connect the moving substrate and the pressing part to each other.

17. The semiconductor test apparatus of claim 16, further comprising an extending portion disposed on a third end of the pressing part and having a thickness larger than a thickness of the pressing part, wherein when the piston is located at the first position, the extending portion is configured to contact with the semiconductor device and wherein the pressing part is insertable into an open groove of the moving substrate.

18. A test contactor for testing a semiconductor device comprising:
    an actuator which is configured to reciprocate between a first position and a second position according to a pressure differential in the actuator;
    a pressing part which is configured to change its location according to the reciprocating motion of the actuator,
    wherein the pressing part is configured to be in contact with the semiconductor device when the actuator is located at the first position, and wherein the pressing part is configured not to be in contact with the semiconductor device when the actuator is located at the second position; and
    a guide block disposed,
    wherein the guide block comprises a V-shaped guide groove configured to guide a path of the pressing part, wherein the V-shaped guide groove forms an obtuse angle, wherein the pressing part includes at least one protrusion formed thereon which is insertable into the V-shaped guide groove, and wherein the at least one protrusion is configured to move along the V-shaped guide groove.

19. The semiconductor test apparatus of claim 18, further comprising a moving substrate connected to the pressing part, wherein the actuator includes a cylinder and a piston which is configured to reciprocate between the first position and the second position according to a change in pressure in the cylinder, wherein the moving substrate is configured to reciprocate in a lengthwise direction of the cylinder according to the reciprocating motion of the piston and wherein when the piston is located at the first position, the pressing part is configured to apply a pressure to one of a lead or a conductive ball of the semiconductor device.

* * * * *